United States Patent
Liu et al.

(10) Patent No.: US 12,504,686 B2
(45) Date of Patent: Dec. 23, 2025

(54) BLACK LIGHT-SHIELDING PHOTOSENSITIVE RESIN COMPOSITION, BLACK MATRIX, BLACK LIGHT-SHIELDING FILM, FRAME AND FILLING MATERIAL FOR SPLICING AREA

(71) Applicant: eChem Solutions Corp., Taoyuan (TW)

(72) Inventors: Meng-Po Liu, Taoyuan (TW); Yu-Chun Chen, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 726 days.

(21) Appl. No.: 17/751,629

(22) Filed: May 23, 2022

(65) Prior Publication Data
US 2022/0404698 A1    Dec. 22, 2022

(30) Foreign Application Priority Data
May 24, 2021   (TW) ................................ 110118602

(51) Int. Cl.
| | | |
|---|---|---|
| *G03F 7/028* | (2006.01) | |
| *G02B 1/04* | (2006.01) | |
| *G02B 5/20* | (2006.01) | |
| *G03F 7/00* | (2006.01) | |
| *G03F 7/004* | (2006.01) | |

(52) U.S. Cl.
CPC ............... *G03F 7/028* (2013.01); *G02B 1/04* (2013.01); *G02B 5/206* (2013.01); *G03F 7/0007* (2013.01); *G03F 7/0047* (2013.01)

(58) Field of Classification Search
None
See application file for complete search history.

(56) References Cited

U.S. PATENT DOCUMENTS

2018/0057670 A1*   3/2018   Kern ................. C08L 23/22

FOREIGN PATENT DOCUMENTS

| | | | | |
|---|---|---|---|---|
| CN | 104062848 |   | 9/2014 | |
| CN | 111752106 |   | 10/2020 | |
| CN | 112442302 | A * | 3/2021 | ............... C09C 1/48 |
| CN | 112578632 | A * | 3/2021 | ............... G03F 7/004 |
| JP | 3836244 |   | 10/2006 | |
| JP | 2011048195 | A * | 3/2011 | |
| JP | 4970326 |   | 7/2012 | |
| JP | 2020101718 | A * | 7/2020 | ............... G03F 7/028 |
| KR | 20170110316 |   | 10/2017 | |
| KR | 2020115218 | A * | 10/2020 | ............... G02B 5/20 |
| KR | 20200115270 | A * | 10/2020 | ............... G03F 7/033 |
| TW | 200815918 |   | 4/2008 | |
| TW | 201129856 |   | 9/2011 | |
| TW | 201540759 |   | 11/2015 | |
| TW | 201632592 |   | 9/2016 | |
| TW | I556013 |   | 11/2016 | |
| TW | I636083 |   | 9/2018 | |
| TW | 201925365 |   | 7/2019 | |
| TW | 202022497 |   | 6/2020 | |
| WO | WO-2017175545 | A1 * | 10/2017 | ............... C08F 2/44 |
| WO | 2020066420 |   | 4/2020 | |

OTHER PUBLICATIONS

"Office Action of Taiwan Counterpart Application", issued on Nov. 10, 2021, p. 1-p. 9.
"Office Action of China Counterpart Application", issued on May 31, 2025, p. 1-p. 10.

* cited by examiner

*Primary Examiner* — Martin J Angebranndt
(74) *Attorney, Agent, or Firm* — JCIPRNET

(57) ABSTRACT

A black light-shielding photosensitive resin composition, a black matrix, a black light-shielding film, a frame, and a filling material for a splicing area are provided. The black light-shielding photosensitive resin composition includes a resin (A), a pigment (B), a monomer (C), an initiator (D), and a solvent (E). The resin (A) includes an epoxy resin (A-1) and a resin (A-2) having an ethylenic unsaturated functional group. The pigment (B) includes black particles (B-1) and hollow particles (B-2).

16 Claims, No Drawings

BLACK LIGHT-SHIELDING PHOTOSENSITIVE RESIN COMPOSITION, BLACK MATRIX, BLACK LIGHT-SHIELDING FILM, FRAME AND FILLING MATERIAL FOR SPLICING AREA

CROSS-REFERENCE TO RELATED APPLICATION

This application claims the priority benefit of Taiwan application Ser. No. 110118602, filed on May 24, 2021. The entirety of the above-mentioned patent application is hereby incorporated by reference herein and made a part of this specification.

BACKGROUND

Technical Field

This disclosure relates to a resin composition, and in particular to a black light-shielding photosensitive resin composition, a black matrix, a black light-shielding film, a frame, and a filling material for a splicing area.

Description of Related Art

As splicing technology is used to increase the size of a micro LED display module, a light-shielding material has to be applied to reduce defects and light reflection, enhance visual experience, and manufacture an optical material required by a panel module. In order to fulfil OD (optical density) light-shielding properties, a certain amount of black color paste has to be added. However, black color paste is a highly reflective material, and an increase in the amount increases reflectance. In addition, a difference in reactivity of an upper layer and a lower layer of black photoresist is likely to cause a wrinkled structure, a decrease in the OD of a thinner area, non-uniformed light shielding properties, with a concern for light leakage. In addition, a black photoresist with good reactivity is usually glossy and shiny, and unable to generate matting properties, with a very low scattering ratio percentage value.

SUMMARY

This disclosure provides a black light-shielding photosensitive resin composition, a black matrix, a black light-shielding film, a frame, and a splicing area. The black matrix, the black light-shielding film, the frame, and the splicing area formed by the black light-shielding photosensitive resin composition resist a structural reflection by low reflectance and have sufficient light shielding capability to reduce bright edges and enhance visual experience.

The black light-shielding photosensitive resin composition of the disclosure includes a resin (A), a pigment (B), a monomer (C), an initiator (D), and a solvent (E). The resin (A) includes an epoxy resin (A-1) and a resin (A-2) having an ethylenic unsaturated functional group. The pigment (B) includes black particles (B-1) and hollow particles (B-2). The epoxy resin (A-1) includes compounds represented by Formula (2), Formula (3), Formula (4), or Formula (5) as follows:

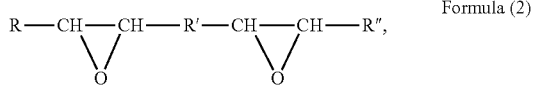

Formula (2)

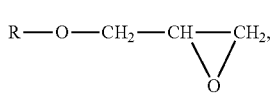

Formula (3)

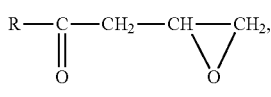

Formula (4)

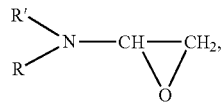

Formula (5)

wherein the Formula (2), the Formula (3), the Formula (4), and the Formula (5), R, R', and R" are each independently at least one substituted cycloalkyl group, benzene group, naphthyl group, biphenyl group, or adamantane.

In an embodiment of the disclosure, the epoxy resin (A-1) includes a compound represented by Formula (6) or Formula (7) as follows:

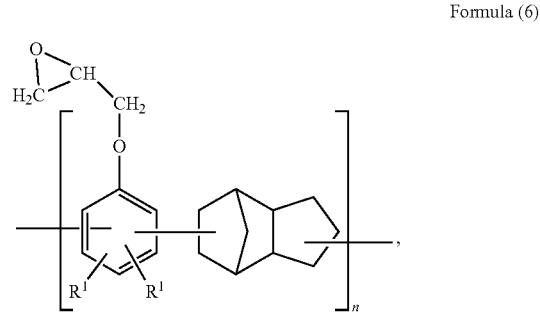

Formula (6)

wherein the Formula (6), $R^1$ represents a hydrogen atom, a halogen atom, an alkyl group having a carbon number of 1 to 8, a cycloalkyl group having a carbon number of 3 to 10, a phenyl group, a naphthyl group, or a biphenyl group, and n is an integer of 1 to 10,

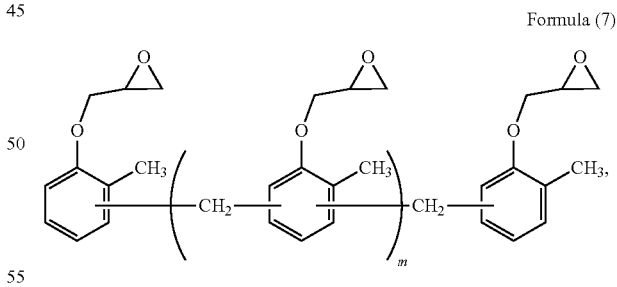

Formula (7)

wherein the Formula (7), m is an integer of 1 to 10.

In an embodiment of the disclosure, the black particles (B-1) include carbon black, titanium black, organic black pigment, or a combination thereof.

In an embodiment of the disclosure, a material of the hollow particles (B-2) includes silicon dioxide.

In an embodiment of the disclosure, the hollow particles (B-2) have a particle diameter coefficient of variation CV value that is greater than 1, and a particle diameter ranging from 1 nm to 1000 nm.

In an embodiment of the disclosure, when a total amount of the resin (A) is 100% by mass, an amount of the epoxy resin (A-1) contained is 1% by mass to 50% by mass.

In an embodiment of the disclosure, when a total amount of the pigment (B) is 100 parts by mass, a proportion of the black particles (B-1) to the hollow particles (B-2) is 85:15 to 15:85.

In an embodiment of the disclosure, when a total amount of the pigment (B) is 100 parts by mass, a proportion of the black particles (B-1) to the hollow particles (B-2) is 50:50 to 20:80.

In an embodiment of the disclosure, the initiator (D) includes a photoinitiator and a thermal polymerization initiator.

In an embodiment of the disclosure, the monomer (C) includes a monomer having at least one reactive functional group.

In an embodiment of the disclosure, a total usage amount of the black light-shielding photosensitive resin composition is 100 parts by weight, a usage amount of the resin (A) is 6 parts by weight to 13 parts by weight, a usage amount of the pigment (B) is 6 parts by weight to 11 parts by weight, a usage amount of the monomer (C) is 0.5 part by weight to 3.5 parts by weight, a usage amount of the initiator (D) is 0.1 part by weight to 2.0 parts by weight, and a usage amount of the solvent (E) is 70 parts by weight to 85 parts by weight.

In an embodiment of the disclosure, the resin (A-2) having an ethylenic unsaturated functional group includes a (meth)acrylic resin.

In an embodiment of the disclosure, the (meth)acrylic resin is composed of (meth)acrylic acid, alkyl (meth)acrylate, hydroxyl-containing (meth)acrylate, ether group-containing (meth)acrylate, or alicyclic (meth)acrylate.

The black matrix of the disclosure is used between two display elements, and is formed by the black light-shielding photosensitive resin composition.

The black light-shielding film of the disclosure is used between two display elements, and is formed by the black light-shielding photosensitive resin composition.

The frame of the disclosure is used between two display elements, and is formed by the black light-shielding photosensitive resin composition.

A filling material for the splicing area of the disclosure is used between two display elements, and is formed by the black light-shielding photosensitive resin composition.

Based on the above, the black light-shielding photosensitive resin composition of the disclosure contains the epoxy resin (A-1) and the resin (A-2) having an ethylenic unsaturated functional group concurrently, therefore it has a good matting capability. In addition, the black light-shielding photosensitive resin composition of the disclosure uses both the black particles (B-1) and the hollow particles (B-2), therefore, reflection can be reduced while generating matting characteristics. On the other hand, an advantage of the black light-shielding photosensitive resin composition of the disclosure is that the hollow particles (B-2) having the particle diameter coefficient of variation CV value that is greater than 1 are used, so as to realize low reflectivity.

DESCRIPTION OF THE EMBODIMENTS

Hereinafter, embodiments of the disclosure are described in detail. However, the embodiments are for illustrative purposes, and the disclosure is not limited thereto.

In this text, a range represented by "a value to another value" is a general representative means to avoid listing all values in the range one by one in the specification. Therefore, a record of a specific numerical range covers any numerical value in the numerical range and a smaller numerical range defined by any numerical value in the numerical range, as if the numerical ranges of the arbitrary numerical value and the smaller numerical value are written in the description of the specification.

It should be noted that the (meth)acrylic acid is represented by the acrylic acid and/or the methacrylic acid is represented by, and acrylate and/or methacrylate is represented by (meth)acrylate.

[Black Light-Shielding Photosensitive Resin Composition]

The disclosure provides a black light-shielding photosensitive resin composition, which includes a resin (A), a pigment (B), a monomer (C), an initiator (D), and a solvent (E). The various components are described in detail as follows.

Resin (A)

The resin (A) includes an epoxy resin (A-1) and a resin (A-2) having an ethylenic unsaturated functional group.

Epoxy Resin (A-1)

The epoxy resin (A-1) includes compounds represented by Formula (2), Formula (3), Formula (4), or Formula (5) as follows:

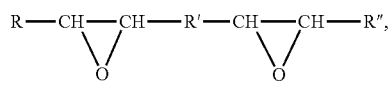

Formula (2)

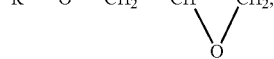

Formula (3)

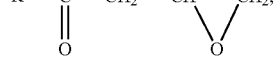

Formula (4)

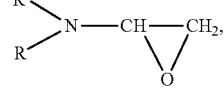

Formula (5)

wherein the Formula (2), the Formula (3), the Formula (4), and the Formula (5), R, R', and R" are each independently at least one substituted cycloalkyl group, benzene group, naphthyl group, biphenyl group, or adamantane.

More specifically, the epoxy resin (A-1) may include alicyclic epoxy resin, linear aliphatic epoxy resin of the Formula (2), glycidyl ether epoxy resin of the Formula (3), glycidyl ester epoxy resin of the Formula (4), or glycidyl amine epoxy resin of the Formula (5).

The alicyclic epoxy resin are represented by a compound having such as a cyclohexene oxide group, a tricyclodecene oxide group, and a cyclopentene oxide group, and a specific example may include vinyl cyclohexene dioepoxide, vinyl cyclohexene monoepoxide, 3,4-epoxycyclohexanecarboxylic acid (3',4'-epoxycyclohexane) methyl ester, 3,4-epoxycyclohexanecarboxylic acid (3',4'-epoxycyclohexane) octyl ester, 1-methyl-4-(2-methyloxiranyl)-7-oxabicyclo[4.1.0]heptane, 2-(3,4-epoxycyclohexyl-5,5-spirocyclo-3,4-epoxy)cyclohexane-m-dioxane, bis(3,4-epoxycyclohexyl)adipate, bis(3,4-epoxycyclohexylmethylene)adipate, or bis(2-methyl-4,5-epoxycyclohexylmethylene)adipate.

In a molecular structure of the linear aliphatic epoxy resin of the Formula (2), an aliphatic chain is mainly used to connect to an epoxy group.

A specific example of the glycidyl ether epoxy resin of the Formula (3) may include bisphenol type A epoxy resin (such as "jER1001" manufactured by Mitsubishi Chemical Co., Ltd.), bisphenol type F epoxy resin, bisphenol type S epoxy resin, resorcinol epoxy resin, phenol novolac epoxy resin, novolac epoxy resin (ortho, meta, p-cresol novolac epoxy resin), biphenyl glycidyl ether phenol epoxy resin, triphenol methane epoxy resin, ethylene glycol or polyethylene glycol epoxy resin, propylene glycol or polypropylene glycol epoxy resin, naphthalene glycol epoxy resin, isocyanate-modified epoxy resin, dicyclopentadiene skeleton epoxy resin (such as "HP-7200L" manufactured by DIC Co., Ltd.), positional isomers thereof, or substitutions having substituents such as alkyl groups or halogen atoms.

A specific example of the glycidyl ester epoxy resin of the Formula (4) may include diglycidyl phthalate, diglycidyl (methyl)tetrahydrophthalate, diglycidyl (methyl)hexahydrophthalate, diglycidyl isophthalate, diglycidyl dimer acid, or various isomers thereof, etc.

A specific example of the glycidyl amine epoxy resin of the Formula (5) may include tetraglycidyldiaminodiphenylmethane, diglycidylaniline, or tetraglycidylxylylenediamine.

The epoxy resin (A-1) may preferably include a compound represented by Formula (6) or Formula (7) as follows:

Formula (6)

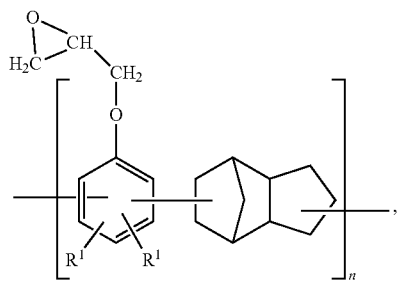

wherein the Formula (6), $R^1$ represents a hydrogen atom, a halogen atom, an alkyl group having a carbon number of 1 to 8, a cycloalkyl group having a carbon number of 3 to 10, a phenyl group, a naphthyl group, or a biphenyl group, and n is an integer of 1 to 10, Formula (7)

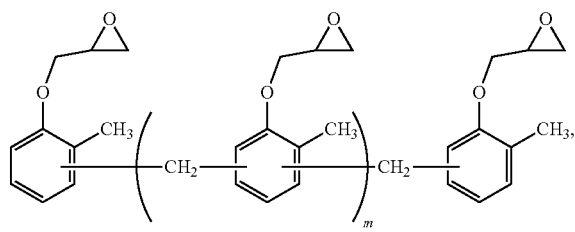

wherein the Formula (7), m is an integer of 1 to 10.

Resin (A-2) Having Ethylenic Unsaturated Functional Group

The resin (A-2) having an ethylenic unsaturated functional group includes at least one ethylenic unsaturated functional group. The resin (A-2) having an ethylenic unsaturated functional group may include a (meth)acrylic resin. For example, the (meth)acrylic resin may be composed of (meth)acrylic acid, alkyl (meth)acrylate, hydroxyl-containing (meth)acrylate, ether group-containing (meth)acrylate, alicyclic (meth)acrylate, or other suitable monomers.

The alkyl (meth)acrylate may include methyl (meth)acrylate, ethyl (meth)acrylate, propyl (meth)acrylate, butyl (meth)acrylate, tertiary butyl (meth)acrylate, benzyl (meth)acrylate, lauryl (meth)acrylate, or other suitable alkyl (meth)acrylates.

The hydroxyl-containing (meth)acrylate may include hydroxyethyl (meth)acrylate, hydroxypropyl (meth)acrylate, or other suitable hydroxyl-containing (meth)acrylates.

The ether group-containing (meth)acrylate may include ethoxyethyl (meth)acrylate, glycidyl (meth)acrylate, or other suitable ether group-containing (meth)acrylates.

The alicyclic (meth)acrylate may include cyclohexyl (meth)acrylate, isophorone (meth)acrylate, dicyclopentadienyl (meth)acrylate, or other suitable alicyclic (meth)acrylates.

Based on a total usage amount of the black light-shielding photosensitive resin composition to be 100 parts by weight, a usage amount of the resin (A) is 6 parts by weight to 13 parts by weight. When a total amount of the resin (A) is 100% by mass, an amount of the epoxy resin (A-1) contained is 1% by mass to 50% by mass.

The black light-shielding photosensitive resin composition contains the epoxy resin (A-1) and the resin (A-2) having an ethylenic unsaturated functional group concurrently, therefore it has a good matting capability. If only the epoxy resin (A-1) or the resin (A-2) having an ethylenic unsaturated functional group is used, as cross-linking reactivity is even, a smooth structure with a bright surface is prone to be formed, therefore unable to provide good matting properties.

Pigment (B)

The pigment (B) includes black particles (B-1) and hollow particles (B-2).

The black particles (B-1) include carbon black, titanium black, organic black pigments, or a combination thereof.

A material of the hollow particles (B-2) includes silicon dioxide. The hollow particles (B-2) have a particle diameter coefficient of variation CV value that is greater than 1, and a particle diameter ranging from 1 nm to 1000 nm. When the black light-shielding photosensitive resin composition uses the hollow particles (B-2) having the particle diameter coefficient of variation CV value that is greater than 1, particle diameter distribution is more even and wide, and may realize low reflectivity. If hollow particles having a particle diameter coefficient of variation CV value that is less than 1 are used, as particle diameter distribution is relatively concentrated, low reflectivity would not be realized.

Based on the total usage amount of the black light-shielding photosensitive resin composition to be 100 parts by weight, a usage amount of the pigment (B) is 6 to 11 parts by weight. When a total amount of the pigment (B) is 100 parts by mass, a proportion of the black particles (B-1) to the hollow particles (B-2) is 85:15 to 15:85, preferably 50:50 to 20:80.

A function of the black particles (B-1) in the black light-shielding photosensitive resin composition is to absorb light and reduce reflection. A function of the hollow particles (B-2) in the black light-shielding photosensitive resin composition is light scattering and to increase light penetration into a light-shielding material to be absorbed by a black body. In this way, light reflection can be reduced and scattering ability can be increased, generating matting characteristics. The black light-shielding photosensitive resin composition of the disclosure uses the black particles (B-1) and the hollow particles (B-2) concurrently, therefore reflection can be reduced and matting characteristics can also be generated. If the black light-shielding photosensitive resin composition does not use the hollow particles (B-2) and the black particles (B-1), and instead uses solid silica spheres, although the surface may exhibit matting properties, disadvantages of whiteness in black chromaticity and high reflectance are present.

Monomer (C)

The monomer (C) includes a monomer having at least one reactive functional group. The monomer containing the reactive functional group may include at least one in a group consisting of a (meth)acrylate monomer, a vinyl monomer, a vinyl ether monomer, and an epoxy monomer. The monomer (C) may be used alone or in a combination of multiple monomers.

The (meth)acrylate monomer may include methyl (meth)acrylate, ethyl (meth)acrylate, n-propyl (meth)acrylate, n-butyl (meth)acrylate, tertiary butyl (meth)acrylate, isobutyl (meth)acrylate, ethylhexyl (meth)acrylate, isodecyl (meth)acrylate, n-hexyl (meth)acrylate, stearyl (meth)acrylate, lauryl (meth)acrylate, dodecyl (meth)acrylate, ethoxyethyl (meth)acrylate, methoxyethyl (meth)acrylate, glycidyl (meth)acrylate, butoxyethyl (meth)acrylate, 2-hydroxyethyl (meth)acrylate, 2-hydroxypropyl (meth)acrylate, 2-methoxyethyl (meth)acrylate, 2-ethoxyethoxyethyl (meth)acrylate, methoxydiethylene glycol (meth)acrylate, ethoxydiethylene glycol (meth)acrylate, methoxydipropylene glycol (meth)acrylate, octafluoropentyl (meth)acrylate, N,N-dimethylaminoethyl (meth)acrylate, N,N-diethylaminoethyl (meth)acrylate, allyl (meth)acrylate, 1,3-butanediol (meth)acrylate, 1,4-butanediol (meth)acrylate, methylacryloyl morpholine, 1,6-hexanediol (meth)acrylate, polyethylene glycol di(meth)acrylate, diethylene glycol di(meth)acrylate, neopentyl glycol di(meth)acrylate, triethylene glycol di(meth)acrylate, tripropylene glycol di(meth)acrylate, neopentyl glycol di(meth)acrylate, trihydroxymethylpropane di(meth)acrylate, 1,3-bis(hydroxyethyl)-5,5-dimethylhydantoin, 3-methylpentanediol (meth)acrylate, α,ω-diacryloyl bis(diethyleneglycol) phthalate, trihydroxymethylpropane tri(meth)acrylate, pentaerythritol (meth)acrylate, pentaerythritol hexa(meth)acrylate, dipentaerythritol monohydroxy penta(meth)acrylate, pentaerythritol tri(meth)acrylate, pentaerythritol tetra(meth)acrylate, ethoxylated pentaerythritol tetraacrylate, tri(meth)acrylate of trihydroxyethyl isocyanurate, dipentaerythritol hexa(meth)acrylate, and ethylene oxide and/or propylene oxide adducts of the above-mentioned (meth)acrylates having a hydroxyl group, etc.

The vinyl monomer may include (meth)acrylic acid, maleic acid (anhydride), maleic acid monoalkyl ester, fumaric acid, fumaric acid monoalkyl ester, crotonic acid, itaconic acid, itaconic acid monoalkyl esters, itaconic acid diol monoethers, citraconic acid, citraconic acid monoalkyl esters, (meth)acrylic acid cetyl esters, cinnamic acid, hydroxy styrene, N-hydroxymethyl (meth)acrylamide, hydroxyethyl (meth)acrylate (HEMA), hydroxypropyl (meth)acrylate, 4-hydroxybutyl (meth)acrylate, polyethylene glycol mono(meth)acrylate, polypropylene glycol mono(meth)acrylate, (meth)allyl alcohol, crotyl alcohol, isocrotyl alcohol, 1-butene-3-ol, 2-butene-1-ol, 2-butene-1,4-diol, propargyl alcohol, 2-hydroxyethyl allyl ether (2-propenoxyethanol), 16-hydroxyhexadecyl methacrylate, sucrose allyl ether, glycerol di(meth)acrylate, trimethylolpropane di(meth)acrylate, pentaerythritol tri(meth)acrylate, diglycerol tri(meth)acrylate, sorbitan tri(meth)acrylate, dipentaerythritol penta(meth)acrylate, tetraglycerol penta(meth)acrylate, glycerol bis(meth)allyl ether, trimethylolpropane bis(meth)allyl ether, pentaerythritol tris(meth)allyl ether, diglycerol tris(meth)allyl ether, sorbitan tris(meth)allyl ether, dipentaerythritol penta(meth)allyl ether, tetraglycerol penta(meth)allyl ether, aminoethyl (meth)acrylate, aminoisopropyl (meth)acrylate, aminobutyl (meth)acrylate, aminohexyl methacrylate, N-aminoethyl (meth)acrylamide, (meth)allylamine, crotylamine, aminostyrene, methyl α-acetamide acrylate, N-allylphenylenediamine, or 16-methacryloylhexadecylamine.

The vinyl ether monomer may include ethylene glycol divinyl ether, ethylene glycol monovinyl ether, diethylene glycol divinyl ether, triethylene glycol monovinyl ether, triethylene glycol divinyl ether, propylene glycol diethylene ether, dipropylene glycol divinyl ether, butylene glycol divinyl ether, hexanediol divinyl ether, cyclohexanedimethanol divinyl ether, hydroxyethyl monovinyl ether, hydroxynonyl monovinyl ether, trihydroxymethylpropane trivinyl ether or other di- or tri-ethylene ether compounds, ethyl vinyl ether, n-butyl vinyl ether, isobutyl vinyl ether, octadecyl vinyl ether, cyclohexyl vinyl ether, hydroxybutyl vinyl ether, 2-ethylhexyl vinyl ether, cyclohexanedimethanol monovinyl ether, n-propyl vinyl ether, isopropyl vinyl ether, dodecyl vinyl ether, diethylene glycol monovinyl ether, octadecyl vinyl ether, and other monovinyl ether compounds, etc.

The epoxy monomer may include a diglycidyl ether of bisphenols such as biphenol, bisphenol A, hydrogenated bisphenol A, bisphenol F, bisphenol AD, bisphenol S, tetramethylbisphenol A, tetramethylbisphenol F, tetrachlorobisphenol A, and tetrabromobisphenol A; a polyglycidyl ether of novolac resins such as phenol novolac, cresol novolac, brominated phenol novolac, and o-cresol novolac; an diglycidyl ethers of alkyl glycol such as ethylene glycol, polyethylene glycol, polypropylene glycol, butylene glycol, 1,6-hexanediol, neopentyl glycol, trihydroxypropane, 1,4-cyclohexanedimethanol, ethylene oxide adduct of bisphenol A, and epoxypropane adduct of bisphenol A; a glycidyl ester such as glycidyl sorbitol, tris(2,3-epoxypropyl) isocyanurate, triglycidyl tris(2-hydroxyethyl) isocyanurate, glycidyl hexahydrophthalate, and diglycidyl dimeric acid; and an alicyclic epoxy compound such as 3',4'-epoxycyclohexanecarboxylic acid 3,4-epoxycyclohexyl methyl ester (trade name Celloxide 2021P manufactured by Daicel), 3',4'-epoxycyclohexanecarboxylic acid 3,4-epoxycyclohexyl ethyl ester, 3',4'-epoxy-6'-methylcyclohexanecarboxylic acid 3,4-epoxy-6-methylcyclohexyl ester, vinyl cyclohexene dioxide, 3,4-epoxy-4-methylcyclohexyl-2-epoxypropane, 2-(3,4-epoxycyclohexyl-5,5-spirocyclic-3,4-epoxy)cyclohexane-m-dioxane, bis(3,4-epoxycyclohexyl) adipate, bis(3,4-epoxycyclohexylmethyl) adipate, lactone modified 3',4'-epoxycyclohexanecarboxylic acid 3,4-epoxycyclohexylmethyl ester, methylene bis(3,4-epoxycyclohexane), ethylene bis(3,4-epoxycyclohexanecarboxylate ester), dicyclopentadiene diepoxide, bis(3,4-epoxycyclohexyl) ether, bis(3,4-epoxycyclohexylmethyl) ether, tetra(3,4-epoxycyclohexylmethyl) butanetetracarboxylate ester, bis(3,4-epoxycyclohexylmethyl)-4,5-epoxytetrahydrophthalate, 1,2:8,9-dicyclolimonene, and bis(3,4-epoxycyclohexyl)diethylsiloxane.

The monomer (C) is preferably at least one selected from a group consisting of compounds represented by Formulas (C-1) to (C-4) as follows Formula (C-1)

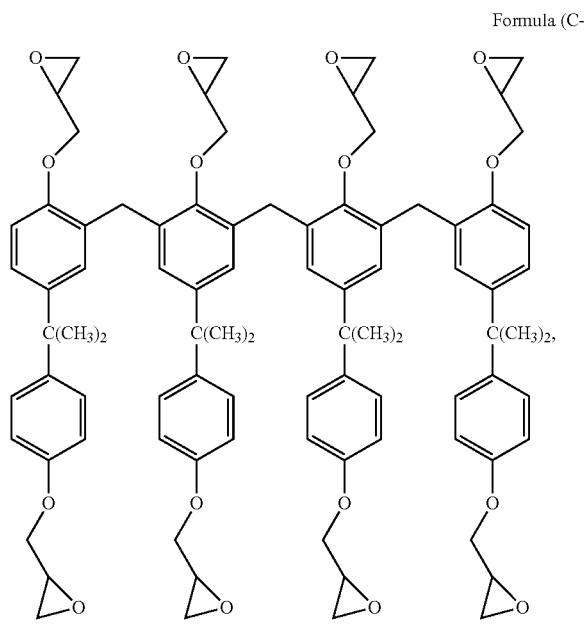

Formula (C-2)

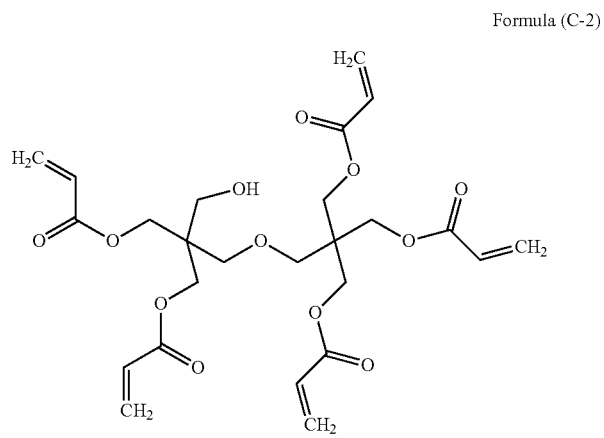

Formula (C-3)

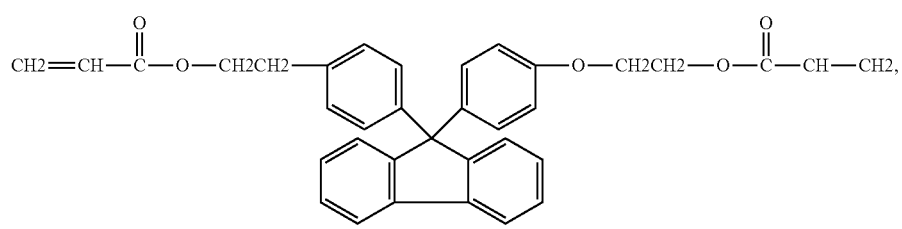

Formula (C-4)

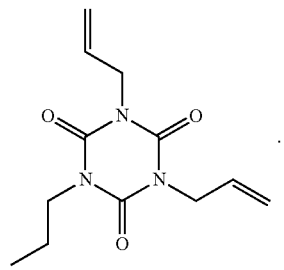

Based on the total usage amount of the black light-shielding photosensitive resin composition to be 100 parts by weight, and a usage amount of the monomer (C) is 0.5 part by weight to 3.5 parts by weight.

A function of the monomer (C) in the black light-shielding photosensitive resin composition is to participate in a polymerization reaction so that a film layer with a high cross-linking density may be formed.

Initiator (D)

The initiator (D) includes a photoinitiator and a thermal polymerization initiator.

The photoinitiator includes at least one selected from a group formed by oxime ester derivatives (oxime ester compounds), triazine compounds, acetophenone compounds, diphenyl ketone compounds, diimidazole compounds, thioxanthone compounds, quinones, acylphosphine oxide, and acyl oxime, where the oxime ester derivative (oxime ester compound) is preferred.

The oxime compound that may be preferably used is, for example, 3-benzoyloxyiminobutan-2-one, 3-acetamidoiminobutan-2-one, 3-propionamidoiminobutan-2-one, 2-acetamidoiminopentan-3-one, 2-acetamidoimino-1-phenylpropan-1-one, 2-benzoyloxyimino-1-phenylpropan-1-one, 3-(4-toluenesulfonyloxy) iminobutan-2-one, or 2-ethoxy oxyimino-1-phenylpropan-1-one, etc.

The oxime ester compound with a diphenyl sulfide skeleton may also be used for matching. The oxime ester compound with the diphenyl sulfide skeleton may be a commercially available product, such as Irgacure® OXE01 (manufactured by BASF), Irgacure® OXE04 (manufactured by BASF), NCI-730 (manufactured by ADEKA Co., Ltd.), NCI-930 (manufactured by ADEKA Co., Ltd.), but is not limited thereto.

The oxime ester compound with a carbazole skeleton may also be used for matching. The oxime ester compound with the carbazole skeleton may be a commercially available product, such as Irgacure® OXE02 (manufactured by BASF), Irgacure® OXE03 (manufactured by BASF), NCI-1919 (manufactured by ADEKA Co., Ltd.), NCI-831 (manufactured by ADEKA Co., Ltd.), but is not limited thereto.

The triazine compound may include chemcure-PAG-1 (trade name, manufactured by Chembridge International Corp.), chemcure-PAG-2 (trade name, manufactured by Chembridge International Corp.), or other suitable triazine compounds. The triazine compound may be used alone or in a combination of multiple types.

The acetophenone compound may include Irgacure 907, 369E (trade name, manufactured by BASF), chemcure-96 (trade name, manufactured by Chembridge International Corp.), or other suitable acetophenone compounds. The acetophenone compound may be used alone or in a combination of multiple types.

The diphenyl ketone compound may include chemcure-BP, chemcure-64 (trade name, manufactured by Chembridge International Corp.), or other suitable diphenyl ketone compounds.

The diphenyl ketone compound may be used alone or in a combination of multiple types.

The diimidazole compound may include Chemcure-BCIM and Chemcure-TCDM (trade names, manufactured by Chembridge International Corp.), or other suitable diimidazole compounds. The diimidazole compounds may be used alone or in a combination of multiple types.

The thioxanthone compound may include Irgacure ITX (trade name, manufactured by BASF), or other suitable thioxanthone compounds. The thioxanthone compound may be used alone or in a combination of multiple types.

A suitable quinone compound may be selected for the quinone compound. The quinone compound may be used alone or in a combination of multiple types.

The acylphosphine oxide may include Irgacure TPO and Irgacure 819 (trade names, manufactured by BASF), or other suitable phosphine oxides. The acylphosphine oxide may be used alone or in a combination of multiple types.

The acyl oxime may include any suitable acyl oximes. The acyl oxime may be used alone or in a combination of multiple types.

The thermal polymerization initiator may include an azo compound such as 2,2"-azobisisobutyronitrile (AIBN), 3-methoxypropionitrile, azobispropanedinitrile, dimethyl-(2,2")-azobis(2-methylpropionate), an organic peroxide such as benzoyl peroxide, lauryl peroxide, potassium persulfate, antimony hexafluoride, or an ammonium salt compound.

Based on the total usage amount of the black light-shielding photosensitive resin composition to be 100 parts by weight, and a usage amount of the initiator (D) is 0.1 part by weight to 2.0 parts by weight.

A function of the initiator (D) in the black light-shielding photosensitive resin composition is to generate free radicals to initiate the polymerization reaction during an exposure process, and the photoinitiator is concurrently matched with the thermal polymerization initiator to complete a cross-linking reaction.

Solvent (E)

The solvent (E) may include propylene glycol methyl ether acetate (PGMEA) and other high boiling point solvents such as 3-ethoxy ethyl propionate (EEP), ethyl pyruvate (PE), ethyl lactate, butyl lactate, benzyl alcohol, 3-methoxybutyl acetate (MBA), 3-methoxy-3-methylbutanol, 1,4-butanediol diacrylate (BDDA), γ-butyrolactone, or propylene glycol monobutyl ether; high surface tension solvents such as γ-butyrolactone, N-methylpyrrolidone, dimethyl sulfide (DMSO), BDGAC, and EDG; or low boiling point solvents such as methyl n-isoamyl (methyl) ketone, methyl ethyl ketone, and isopropanol.

Based on a total usage amount of the black light-shielding photosensitive resin composition to be 100 parts by weight, a usage amount of the solvent (E) is 70 parts by weight to 85 parts by weight.

A function of the solvent (E) is to enable the black light-shielding photosensitive resin composition to have an appropriate viscosity, and to be adaptable to different coating process changes.

<Preparation Method of Black Light-Shielding Photosensitive Resin Composition>

A preparation method of the black light-shielding photosensitive resin composition is not particularly limited. For example, the resin (A), the pigment (B), the monomer (C), the initiator (D) and the solvent (E) are placed in a stirrer and mixed evenly to obtain a black light-shielding photosensitive resin composition in an aqueous state.

<Manufacturing Method of Black Light-Shielding Material>

An exemplary embodiment of the disclosure provides a black light-shielding material formed using the black light-shielding photosensitive resin composition. The black light-shielding material may include a black matrix, a black light-shielding film, a frame, or a filling material for a splicing area, and is used between two display elements.

The black light-shielding photosensitive resin composition is coated on a substrate, and depressurization to 133 Pa is performed to remove excess solvent. After that, the black light-shielding photosensitive resin composition is placed on a hot plate at a temperature of 100° C. and pre-baked for 5 to 10 minutes to form a thin film. Next, a high-pressure mercury lamp is used to irradiate the black light-shielding photosensitive resin composition with an exposure amount of 100 mJ/cm$^2$ to 300 mJ/cm$^2$. After irradiation, the black light-shielding photosensitive resin composition is placed in an oven at a temperature of 150° C. for post-baking of 10 minutes to 30 minutes, so as to obtain a black light-shielding material. The obtained black light-shielding material may be a thin film with a thickness of 3.0 μm to 6.0 μm.

The substrate may be a glass substrate, a plastic base material (for example, a polyether sulfide (PES) board, a polycarbonate (PC) board, or a polyimide (PI) film), or other light transmitting substrates, in which its type is not particularly limited.

A coating method is not particularly limited, but a spray coating method, a roll coating method, a spin coating method, or similar methods may be used, and in general, the spin coating method is widely used.

The disclosure is described in detail with reference to examples as follows. The following examples are provided to describe the disclosure, and a scope of the disclosure includes a scope of a range of the following patent application, its substitutions, and modifications, and is not limited to the scope of the examples.

Embodiments of Black Light-Shielding
Photosensitive Resin Composition and Black
Light-Shielding Material Embodiments 1 to 11 and comparative examples 1 to 8 of the black light-shielding photosensitive resin composition and the black light-shielding material are described as follows.

Embodiment 1 a. Black Light-Shielding Photosensitive Resin Composition

Add 2 parts by weight of HP-7200L (manufactured by DIC Co., Ltd.), 8 parts by weight of a resin A-4 as in Table 1, 7.1 parts by weight of Black carbon black paste (manufactured by Tokushiki Co., Ltd.), 1.3 parts by weight of Hollow Silica dispersion solution (manufactured by Sanyo Color Co., Ltd., with a particle diameter of 54 nm±82 nm and a particle diameter distribution of 2 nm to 450 nm), 0.45 parts by weight of DPHA, 0.45 parts by weight of a monomer C-3 in the Table 1, 0.35 parts by weight of Irgacure® OXE03 (manufactured by BASF), and 0.35 parts by weight of an initiator D-3 in the Table 1 to 80 parts by weight of the propylene glycol methyl ether acetate PGMEA, and after evenly stirring with a stirrer, a black light-shielding photosensitive resin composition of the embodiment 1 is obtained.

b. Light Conversion Layer

Each of the obtained resin compositions of the embodiment is coated on a glass substrate by a spin coating method/spraying method, and depressurization to 133 Pa is performed to remove the excess solvent. After that, the black light-shielding photosensitive resin composition is placed on a hot plate at a temperature of 100° C. and pre-baked for 5 minutes to 10 minutes, so as to form a thin film. Then, a high-pressure mercury lamp (EL S106SA) containing g, h, and i lines is used to irradiate the black light-shielding photosensitive resin composition with an exposure amount of 100 mJ/cm² to 300 mJ/cm². After irradiation, the black light-shielding photosensitive resin composition is placed in an oven at a temperature of 150° C. for post-baking of 10 minutes to 30 minutes, so as to obtain a black light-shielding material. The obtained black light-shielding material maybe a thin film with a thickness of 3.0 μm to 6.0 μm. The obtained black light-shielding material is evaluated by evaluation means as follows, and results are shown in Table 3.

Embodiments 2 to 11 and Comparative Examples 1 to 8

A black light-shielding photosensitive resin composition of the embodiments 2 to 11 and comparative examples 1 to 8 is prepared in steps same as the steps in the embodiment 1, except for a difference, which is changing ingredient types and their usage amounts of the black light-shielding photosensitive resin composition (as shown in Table 2), in which the constituents/compounds corresponding to the reference numerals in the Table 2 are shown in the Table 1. Evaluation is performed on the black light-shielding material that is manufactured using the obtained black light-shielding photosensitive resin composition by the following evaluation means, which results are shown in the Table 3.

TABLE 1

| | Reference numerals | Ingredients/compounds |
|---|---|---|
| Resin (A) | A-1 | HP-7200L (manufactured by DIC Corporation) |
| | A-2 | jER-1001 (manufactured by Mitsubishi Chemical Corporation) |
| | A-3 | EOCN-103S (manufactured by Nippon Kayaku Co., Ltd.) |
| | A-4 | A resin containing monomers as follows: |

[Chemical structures of three monomer units with subscripts a, b, c]

MW = 15000
AV(acid value) = 105
a = 30% to 50%, b = 25% to 45%, c = 25% to 45%

TABLE 1-continued

| Reference numerals | Ingredients/compounds |
|---|---|
| | A-5    A resin containing monomers as follows:: 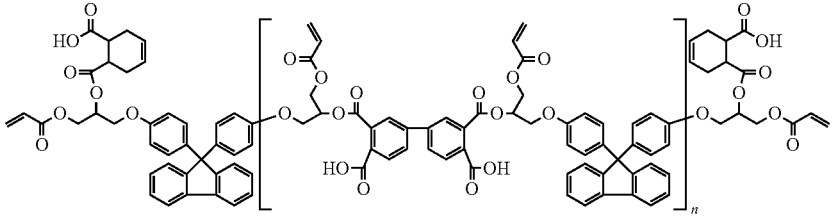 MW = 3300<br>AV(acid value) = 100 |
| | A-6    A resin containing monomers as follows:: 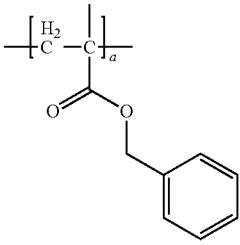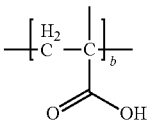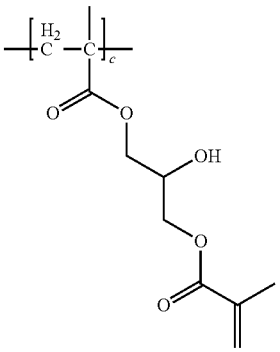 MW = 55000<br>AV(acid value) = 80<br>a = 30% to 50%, b = 25% to 45%, c = 25% to 45% |
| Pigment (B) | B-1    Black carbon black paste (manufactured by Tokushiki Co., Ltd.) |
| | B-2    Black titanium black paste (manufactured by Tokushiki Co., Ltd.) |
| | B-3    Black organic black paste (manufactured by Iridos) |
| | B-4    Silica dispersion solution (manufactured by Sanyo Color Co., Ltd., with a particle diameter of 54 nm ± 82 nm and a particle diameter distribution of 2 nm to 450 nm) |
| | B-5    Hollow Silica dispersion solution (manufactured by Sanyo Color Co., Ltd., with a particle diameter of 132 nm ± 157 nm and a particle diameter distribution of 5 nm to 881 nm) |
| | B-6    Hollow Silica dispersion solution (manufactured by Sanyo Color Co., Ltd., with a particle diameter of 420 nm ± 323 nm and a particle diameter distribution of 62 nm to 1780 nm) |
| | B-7    Hollow Silica dispersion solution (manufactured by Sanyo Color Co., Ltd., with a particle diameter of 96 nm ± 43 nm and a particle diameter distribution of 50 nm to 198 nm) |

TABLE 1-continued

| Reference numerals | Ingredients/compounds |
|---|---|
| B-8 | Hollow Silica dispersion solution (manufactured by Sanyo Color Co., Ltd., with a particle diameter of 120 nm ± 82 nm and a particle diameter distribution of 229 nm to 450 nm) |
| B-9 | Silica dispersion solution (manufactured by Nissan Chemical Co., Ltd., with a particle diameter of 31.6 nm ± 37.2 nm and a particle diameter distribution of 2 nm to 187 nm) |

Monomer (C) C-1

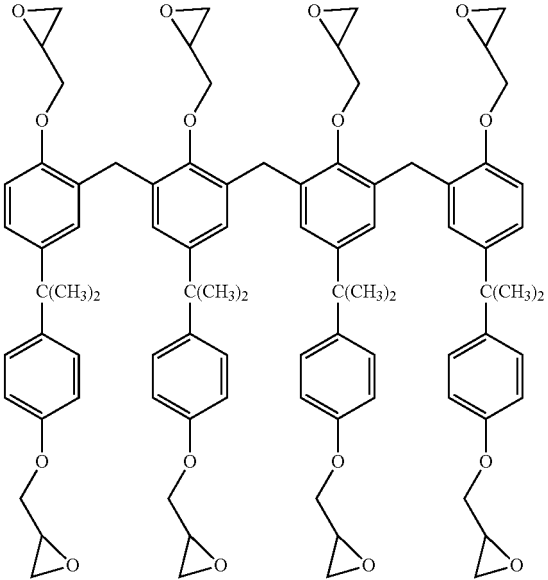

Formula (C-1)

C-2

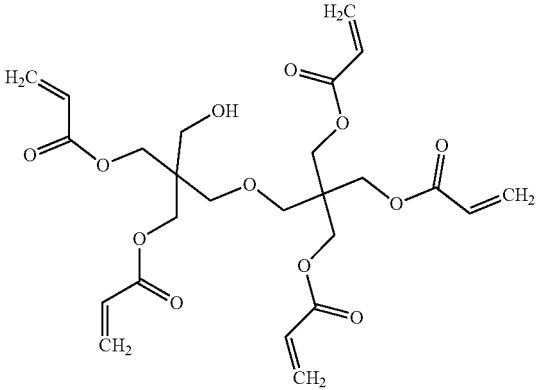 [SMILES: C=CC(=O)OCC(CO)(COCC(COC(=O)C=C)(COC(=O)C=C)COC(=O)C=C)COC(=O)C=C]

Formula (C-2)

C-3

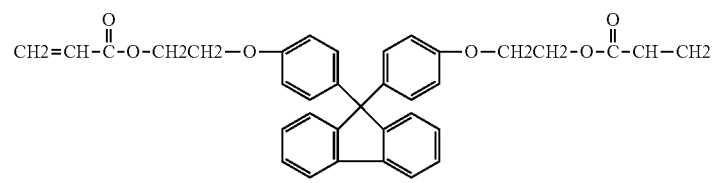

Formula (C-3)

TABLE 1-continued

| Reference numerals | Ingredients/compounds |
|---|---|
| C-4 | (structure shown) Formula (C-4) |
| Initiator (D) D-1 | Irgacure ® OXE03 (manufactured by BASF) |
| D-2 | Irgacure ® OXE02 (manufactured by BASF) |
| D-3 | An ammonium salt initiator containing a chemical formula as follows: (SbF$_6^-$ structure shown) |
| Solvent (E) E-1 | Propylene glycol methyl ether acetate PGMEA |

TABLE 2

| Ingredients (unit: parts by weight) | | Embodiment 1 | Embodiment 2 | Embodiment 3 | Comparative example 1 | Comparative example 2 |
|---|---|---|---|---|---|---|
| Resin (A) | A-1 | 2 | 3.5 | 5 | 3.5 | 3.5 |
| | A-2 | | | | | |
| | A-3 | | | | | |
| | A-4 | 8 | | | | |
| | A-5 | | 6.5 | | 6.5 | 6.5 |
| | A-6 | | | 5 | | |
| Pigment (B) | B-1 | 7.1 | 7.1 | 7.1 | 8.4 | 8.4 |
| | B-2 | | | | | |
| | B-3 | | | | | |
| | B-4 | 1.3 | 1.3 | 1.3 | | |
| | B-5 | | | | | |
| | B-6 | | | | | |
| | B-7 | | | | | |
| | B-8 | | | | | |
| | B-9 | | | | | |
| Monomer (C) | C-1 | | | | | 0.45 |
| | C-2 | 0.45 | 0.45 | 0.45 | 0.45 | 0.45 |
| | C-3 | 0.45 | 0.45 | 0.45 | 0.45 | |
| | C-4 | | | | | |
| Initiator (D) | D-1 | 0.35 | 0.35 | 0.35 | 0.35 | |
| | D-2 | | | | | 0.35 |
| | D-3 | 0.35 | 0.35 | 0.35 | 0.35 | 0.35 |
| Solvent (E) | E-1 | 80 | 80 | 80 | 80 | 80 |

| Ingredients (unit: parts by weight) | | Embodiment 4 | Embodiment 5 | Embodiment 6 | Comparative example 3 | Comparative example 4 |
|---|---|---|---|---|---|---|
| Resin (A) | A-1 | | | | 3.5 | |
| | A-2 | 1.8 | 3.3 | 3.3 | | |
| | A-3 | | | | | 4.2 |
| | A-4 | | | | | |
| | A-5 | | | | 6.5 | 4.9 |
| | A-6 | 7.2 | 4.9 | 4.9 | | |

TABLE 2-continued

| | | | | | | |
|---|---|---|---|---|---|---|
| Pigment (B) | B-1 | 4.5 | 1.8 | 4.5 | 7.1 | 1.8 |
| | B-2 | | | | | |
| | B-3 | | | | | |
| | B-4 | 4.1 | 6.8 | 4.1 | | |
| | B-5 | | | | | |
| | B-6 | | | | | 6.8 |
| | B-7 | | | | | |
| | B-8 | | | | | |
| | B-9 | | | | 1.3 | |
| Monomer (C) | C-1 | 1.7 | 1.5 | 1.5 | | 1.5 |
| | C-2 | | 1.3 | 1.3 | 0.45 | 1.3 |
| | C-3 | | 0.3 | 0.3 | 0.45 | 0.3 |
| | C-4 | 1.5 | | | | 0.05 |
| Initiator (D) | D-1 | | 0.05 | 0.05 | 0.35 | 0.05 |
| | D-2 | 0.1 | | | | |
| | D-3 | 0.1 | 0.05 | 0.05 | 0.35 | 0.05 |
| Solvent (E) | E-1 | 80 | 80 | 80 | 80 | 80 |

| Ingredients (unit: parts by weight) | | Embodiment 7 | Embodiment 8 | Embodiment 9 | Comparative example 5 | Comparative example 6 |
|---|---|---|---|---|---|---|
| Resin (A) | A-1 | | | | | |
| | A-2 | 3.3 | | | | |
| | A-3 | | 4.2 | 4.2 | 4.2 | 4.2 |
| | A-4 | | | | | |
| | A-5 | | 4.9 | 4.9 | 4.9 | 4.9 |
| | A-6 | 4.9 | | | | |
| Pigment (B) | B-1 | 6.5 | 1.8 | 1.8 | 1.8 | 1.8 |
| | B-2 | | | | | |
| | B-3 | | | | | |
| | B-4 | 2.1 | 6.8 | | | |
| | B-5 | | | 6.8 | | |
| | B-6 | | | | | |
| | B-7 | | | | 6.8 | |
| | B-8 | | | | | 6.8 |
| | B-9 | | | | | |
| Monomer (C) | C-1 | 1.5 | 1.5 | 1.5 | 1.5 | 1.5 |
| | C-2 | 1.3 | 1.3 | 1.3 | 1.3 | 1.3 |
| | C-3 | 0.3 | 0.3 | 0.3 | 0.3 | 0.3 |
| | C-4 | | 0.05 | 0.05 | 0.05 | 0.05 |
| Initiator (D) | D-1 | 0.05 | 0.05 | 0.05 | 0.05 | 0.05 |
| | D-2 | | | | | |
| | D-3 | 0.05 | 0.05 | 0.05 | 0.05 | 0.05 |
| Solvent (E) | E-1 | 80 | 80 | 80 | 80 | 80 |

| Ingredients (unit: parts by weight) | | Embodiment 10 | Embodiment 11 | Comparative example 7 | Comparative example 8 |
|---|---|---|---|---|---|
| Resin (A) | A-1 | | | | 8.9 |
| | A-2 | | | | |
| | A-3 | 4.2 | 4.2 | | |
| | A-4 | | | 9.7 | |
| | A-5 | 4.9 | 4.9 | | |
| | A-6 | | | | |
| Pigment (B) | B-1 | | | 2.6 | 4.3 |
| | B-2 | 1.8 | | | |
| | B-3 | | 1.8 | | |
| | B-4 | 6.8 | 6.8 | | |
| | B-5 | | | 6 | 4.3 |
| | B-6 | | | | |
| | B-7 | | | | |
| | B-8 | | | | |
| | B-9 | | | | |
| Monomer (C) | C-1 | 1.5 | 1.5 | | 1.8 |
| | C-2 | 1.3 | 1.3 | 1 | |
| | C-3 | 0.3 | 0.3 | | |
| | C-4 | 0.05 | 0.05 | | |
| Initiator (D) | D-1 | 0.05 | 0.05 | 0.35 | |
| | D-2 | | | 0.35 | |
| | D-3 | 0.05 | 0.05 | | 0.7 |
| Solvent (E) | E-1 | 80 | 80 | 80 | 80 |

<Measurement Method and Calculation Formula> a. Reflectance Measurement Method and Scattering Ratio Calculation Method

Using a spectrophotometer (2600d manufactured by Konica Minolta Co., Ltd.), SCI (Specular Component Included, including specular reflected light) and SCE (Specular Component Excluded, excluding the specular reflected light) of the black light-shielding material under conditions of a viewing angle of 100 and a light source of D65 are measured.

The scattering ratio (%) calculation method, according to a formula as follows:

$$\text{Scattering Ratio} = \frac{SCE}{SCI} \times 100\%$$

b. L*Value Measurement Method

Using the spectrophotometer (2600d, manufactured by Konica Minolta Co., Ltd.), a L* value of the black light-shielding material under the conditions of the viewing angle of 100 and the light source of D65 is measured.

c. OD Value Measurement Method

A densitometer (361C, manufactured by X-rite) is used to measure an OD value of the black film material.

d. Calculation Method of CV (Coefficient of Variation) Value

The CV (coefficient of variation) value refers to a coefficient of variation (also known as relative standard deviation) of particle diameter distribution of transparent particles. This value is configured to express a degree of diffusion (error of the particle diameter) of the particle diameter distribution relative to an average value (arithmetic average diameter). The calculation method is as follows. The smaller the CV value, the narrower the particle diameter distribution (steeper), and the larger the CV value, the wider and flatter the particle diameter distribution.

$$CV = \frac{\text{Particle diameter standard deviation}}{\text{Particle diameter average value}}$$

TABLE 3

| Evaluation results | | Embodiment 1 | Embodiment 2 | Embodiment 3 | Comparative example 1 | Comparative example 2 |
|---|---|---|---|---|---|---|
| Particle diameter | Standard deviation particle diameter (nm) | 82.1 | 82.1 | 82.1 | — | — |
| | Average particle diameter (nm) | 54.4 | 54.4 | 54.4 | — | — |
| | CV value | 1.51 | 1.51 | 1.51 | — | — |
| Effect | SCI | 2.89 | 2.84 | 2.67 | 3.52 | 4.93 |
| | SCE | 2.64 | 2.73 | 2.6 | 3.05 | 4.81 |
| | Scattering ratio | 91.35% | 96.13% | 97.38% | 86.65% | 97.57% |
| | L* | 19.8 | 18.7 | 19.1 | 25.4 | 26.4 |
| | OD | 4.8 | 5.9 | 5.1 | 4.6 | 4.8 |

| Evaluation results | | Embodiment 4 | Embodiment 5 | Embodiment 6 | Comparative example 3 | Comparative example 4 |
|---|---|---|---|---|---|---|
| Particle diameter | Standard deviation particle diameter (nm) | 82.1 | 82.1 | 82.1 | 37.2 | 323.1 |
| | Average particle diameter (nm) | 54.4 | 54.4 | 54.4 | 31.6 | 420.4 |
| | CV value | 1.51 | 1.51 | 1.51 | 1.18 | 0.77 |
| Effect | SCI | 2.79 | 2.54 | 2.66 | 4.62 | 3.88 |
| | SCE | 2.61 | 2.47 | 2.57 | 4.11 | 3.82 |
| | Scattering ratio | 93.55% | 97.24% | 96.62% | 88.96% | 98.45% |
| | L* | 18.8 | 18.3 | 18.6 | 31.7 | 20.5 |
| | OD | 5.8 | 4.6 | 4.6 | 5.5 | 4.08 |

| Evaluation results | | Embodiment 7 | Embodiment 8 | Embodiment 9 | Comparative example 5 | Comparative example 6 |
|---|---|---|---|---|---|---|
| Particle diameter | Standard deviation particle diameter (nm) | 82.1 | 82.1 | 157.2 | 43.7 | 82.3 |

TABLE 3-continued

|  |  |  |  |  |  |  |
|---|---|---|---|---|---|---|
| | Average particle diameter (nm) | 54.4 | 54.4 | 132.3 | 96.6 | 119.7 |
| | CV value | 1.51 | 1.51 | 1.19 | 0.45 | 0.69 |
| Effect | SCI | 2.97 | 2.49 | 2.42 | 4.74 | 4.93 |
| | SCE | 2.92 | 2.48 | 2.41 | 4.44 | 4.7 |
| | Scattering ratio | 98.32% | 99.60% | 99.59% | 93.67% | 95.33% |
| | L* | 19.9 | 18.1 | 17.5 | 22.1 | 23.7 |
| | OD | 5.7 | 4.2 | 4.7 | 4.2 | 4.2 |

| | Evaluation results | Embodiment 10 | Embodiment 11 | Comparative example 7 | Comparative example 8 |
|---|---|---|---|---|---|
| Particle diameter | Standard deviation particle diameter (nm) | 82.1 | 82.1 | 157.2 | 157.2 |
| | Average particle diameter (nm) | 54.4 | 54.4 | 132.3 | 132.3 |
| | CV value | 1.51 | 1.51 | 1.19 | 1.19 |
| effect | SCI | 2.56 | 2.7 | 4.66 | 4.52 |
| | SCE | 2.52 | 2.67 | 1.86 | 0.46 |
| | Scattering ratio | 98.44% | 98.89% | 39.91% | 10.12% |
| | L* | 18.5 | 18.4 | 24.4 | 28.3 |
| | OD | 4.5 | 4.2 | 4.6 | 5.5 |

<Evaluation Results>

It can be seen from the Table 2 and the Table 3 that, compared with the comparative examples 7 and 8, the comparative examples 1 to 6 and the embodiments 1 to 7 contain the epoxy resin (A-1) and the resin (A-2) having the ethylenic unsaturated functional group concurrently, therefore, the matting effect represented by the scattering ratio are all more than 85%, preferably even greater than 90%, and have a good matting capability. However, the comparative examples 1 and 2 only use the black particles (B-1), and not the hollow particles (B-2), while the comparative example 3 uses the black particles (B-1) in addition to the solid silica balls. Therefore, although the surface has matting properties, the black chromaticity is whiter and the reflectance is higher, causing inability to realize L*<20 and, SCI and SCE<3.

On the other hand, in the embodiments 1 to 11, in the selection of the particle diameter of the added hollow particles (B-2), the particle diameter distribution coefficient of variation CV value is greater than 1, and the distribution is more even and wide, and low reflectivity and a better L*effect can be obtained. Compared with the comparative examples 4 to 6, although the embodiments 8 and 9 are also mixed formulations containing both the epoxy resin (A-1) and the resin (A-2) having the ethylenic unsaturated functional group with the added hollow particles, the particle diameter distribution of the hollow particles used in the comparative examples 4 to 6 is relatively concentrated (the coefficient of variation CV value of the particle diameter distribution is less than 1), causing the SCI and the SCE to be too high to realize the low reflectivity.

In the embodiments 10 and 11, different types of the black particles (B-1) are matched with the hollow particles (B-2) having a coefficient of variation CV value of the particle diameter distribution that is greater than 1, and both have good low reflectivity and a better light-shielding property OD>3, in which the proportion of the black particles (B-1) to the hollow particles (B-2) may be 85:15 to 15:85.

As for the comparative examples 7 and 8, although the hollow particles (B-2) having a coefficient of variation CV value of the particle diameter distribution that is greater than 1 are also used, only the epoxy resin (A-1) or the resin (A-2) having the ethylenic unsaturated functional group is used. As the cross-linking reactivity is even, a smooth structure with a bright surface is prone to be formed, and the scattering ratio is far less than 90%, therefore unable to provide good matting properties.

In summary, the black light-shielding photosensitive resin composition of the disclosure contains the epoxy resin (A-1) and the resin (A-2) having the ethylenic unsaturated functional group concurrently, and therefore it has a good matting capability. In addition, the black light-shielding photosensitive resin composition of the disclosure uses both the black particles (B-1) and the hollow particles (B-2). Therefore, reflection can be reduced while generating the matting characteristics. The function of the black particles (B-1) in the black light-shielding photosensitive resin composition is to absorb light and reduce reflection. The function of the hollow particles (B-2) in the black light-shielding photosensitive resin composition is light scattering and to increase light penetration into the light-shielding material to be absorbed by the black body. In this way, light reflection can be reduced and scattering ability can be increased, generating the matting characteristics. On the other hand, the black light-shielding photosensitive resin composition of the disclosure preferably selects the hollow particles (B-2) having the particle diameter coefficient of variation CV value that is greater than 1, which distribution is more even and wide, so as to realize low reflectivity.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A black light-shielding photosensitive resin composition, comprising:
   a resin (A), comprising an epoxy resin (A-1) and a resin (A-2) having an ethylenic unsaturated functional group;
   a pigment (B), comprising black particles (B-1) and hollow particles (B-2);
   a monomer (C);

an initiator (D); and
a solvent (E),
wherein the epoxy resin (A-1) comprises a compound represented by Formula (2), Formula (3), Formula (4), or Formula (5) as follows,

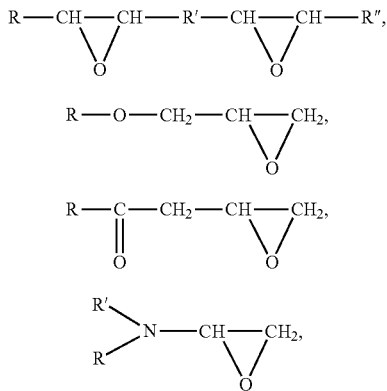

wherein the Formula (2), the Formula (3), the Formula (4), and the Formula (5), R, R', and R" are each independently at least one substituted cycloalkyl group, benzene group, naphthyl group, biphenyl group, or adamantane, wherein the hollow particles (B-2) have a particle diameter coefficient of variation CV value that is greater than 1, and the particle diameter coefficient of variation CV value is defined as:

CV=Particle diameter standard deviation/Particle diameter average value wherein a total usage amount of the black light-shielding photosensitive resin composition is 100 parts by weight, a usage amount of the pigment (B) is 6 parts by weight to 11 parts by weight, wherein when a total amount of the pigment (B) is 100 parts by mass, a proportion of the black particles (B-1) to the hollow particles (B-2) is 85:15 to 15:85.

2. The black light-shielding photosensitive resin composition according to claim 1, wherein the epoxy resin (A-1) comprises a compound represented by Formula (6) or Formula (7) as follows:

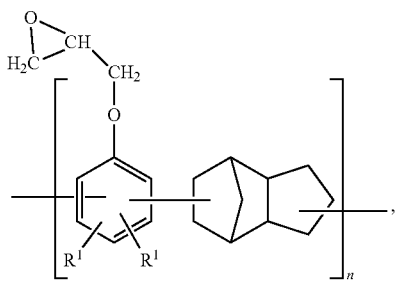

wherein the Formula (6), $R^1$ represents a hydrogen atom, a halogen atom, an alkyl group having a carbon number of 1 to 8, a cycloalkyl group having a carbon number of 3 to 10, a phenyl group, a naphthyl group, or a biphenyl group, and n is an integer of 1 to 10,

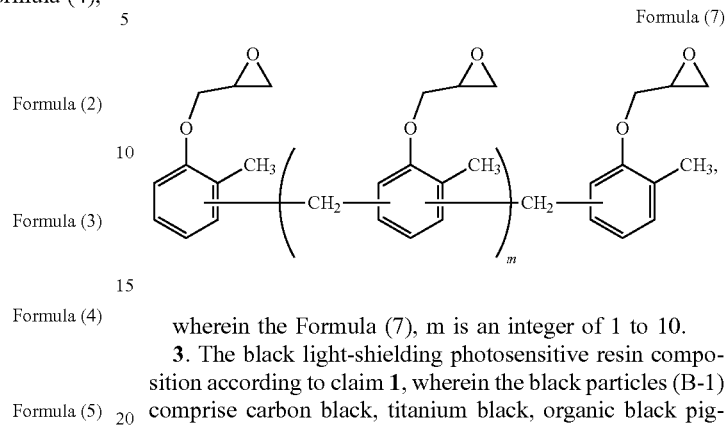

wherein the Formula (7), m is an integer of 1 to 10.

3. The black light-shielding photosensitive resin composition according to claim 1, wherein the black particles (B-1) comprise carbon black, titanium black, organic black pigment, or a combination thereof.

4. The black light-shielding photosensitive resin composition according to claim 1, wherein a material of the hollow particles (B-2) comprises silicon dioxide.

5. The black light-shielding photosensitive resin composition according to claim 1, the hollow particles (B-2) have a particle diameter ranging from 1 nm to 1000 nm.

6. The black light-shielding photosensitive resin composition according to claim 1, wherein when a total amount of the resin (A) is 100% by mass, an amount of the epoxy resin (A-1) contained is 1% by mass to 50% by mass.

7. The black light-shielding photosensitive resin composition according to claim 1, wherein when the total amount of the pigment (B) is 100 parts by mass, a proportion of the black particles (B-1) to the hollow particles (B-2) is 50:50 to 20:80.

8. The black light-shielding photosensitive resin composition according to claim 1, wherein the initiator (D) comprises a photoinitiator and a thermal polymerization initiator.

9. The black light-shielding photosensitive resin composition according to claim 1, wherein the monomer (C) comprises a monomer having at least one reactive functional group.

10. The black light-shielding photosensitive resin composition according to claim 1, wherein the total usage amount of the black light-shielding photosensitive resin composition is 100 parts by weight, a usage amount of the resin (A) is 6 parts by weight to 13 parts by weight, a usage amount of the monomer (C) is 0.5 part by weight to 3.5 parts by weight, a usage amount of the initiator (D) is 0.1 part by weight to 2.0 parts by weight, and a usage amount of the solvent (E) is 70 parts by weight to 85 parts by weight.

11. The black light-shielding photosensitive resin composition according to claim 1, wherein the resin (A-2) having the ethylenic unsaturated functional group comprises a (meth)acrylic resin.

12. The black light-shielding photosensitive resin composition according to claim 11, wherein the (meth)acrylic resin is composed of (meth)acrylic acid, alkyl (meth)acrylate, hydroxyl-containing (meth)acrylate, ether group-containing (meth)acrylate, or alicyclic (meth)acrylate.

13. A black matrix, to be used between two display elements, is formed by the black light-shielding photosensitive resin composition according to claim 1.

14. A black light-shielding film, to be used between two display elements, is formed by the black light-shielding photosensitive resin composition according to claim 1.

15. A frame, to be used between two display elements, is formed by the black light-shielding photosensitive resin composition according to claim 1.

16. A filling material for a splicing area, to be used between two display elements, is formed by the black light-shielding photosensitive resin composition according to claim 1.

\* \* \* \* \*